United States Patent
Todi et al.

(10) Patent No.: US 9,679,623 B2
(45) Date of Patent: Jun. 13, 2017

(54) STACKED CLOCK-GENERATION CIRCUIT

(71) Applicant: Dialog Semiconductor B.V., s-Hertogenbosch (NL)

(72) Inventors: Rahul Todi, Eindhoven (NL); Mark Stefan Oude Alink, Delden (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 15/245,294

(22) Filed: Aug. 24, 2016

(65) Prior Publication Data

US 2017/0062027 A1 Mar. 2, 2017

(30) Foreign Application Priority Data

Aug. 31, 2015 (DE) .................. 10 2015 216 637

(51) Int. Cl.
| | |
|---|---|
| *G11C 7/22* | (2006.01) |
| *G11C 5/02* | (2006.01) |
| *G11C 5/06* | (2006.01) |
| *G11C 7/10* | (2006.01) |

(52) U.S. Cl.
CPC .................. *G11C 7/22* (2013.01); *G11C 5/02* (2013.01); *G11C 5/06* (2013.01); *G11C 7/1072* (2013.01); *G11C 7/222* (2013.01)

(58) Field of Classification Search
CPC .......... G11C 7/22; G11C 7/1072; G11C 7/222
USPC ............................. 365/233.1, 49.11, 189.05
See application file for complete search history.

(56) References Cited

U.S. PATENT DOCUMENTS

| | | | |
|---|---|---|---|
| 6,841,983 B2* | 1/2005 | Thomas | H02M 3/157 323/322 |
| 9,018,987 B1 | 4/2015 | Lahiri | |

OTHER PUBLICATIONS

"A 1.8 V 900 μW 4.5 GHz VCO and Prescaler in 0.18 μm CMOS Using Charge-Recycling Technique," by Dongmin Park et al, IEEE Microwave and Wireless Components Letters, vol. 19, No. 2, Feb. 2009, pp. 104-106.
"Analysis and Design of Injection-Locked LC Dividers for Quadrature Generation," by Andrea Mazzanti et al, IEEE Journal of Solid-State Circuits, vol. 39, No. 9, Sep. 2004, pp. 1425-1433.
(Continued)

*Primary Examiner* — Jason Lappas
(74) *Attorney, Agent, or Firm* — Saile Ackerman LLC; Stephen B. Ackerman

(57) ABSTRACT

An electronic circuit is disclosed for dividing the frequency of a periodic signal, wherein at least one of the memory elements is arranged with its output terminal connected to the input terminal of another memory element wherein the electronic circuit is configured to generate an output signal having a smaller fundamental frequency than the clock signal at at least one of the output terminals. Each memory element is configured to change and hold a voltage at the output terminal based on a voltage at the input terminal at times controlled by a clock signal received at the clock terminal. At least two of the memory elements are stacked in the sense that the bottom terminal of a first memory element is connected to the top terminal of a second memory element to enable the charge to flow from the first memory element to the second memory element.

20 Claims, 11 Drawing Sheets

(56) References Cited

OTHER PUBLICATIONS

"Flip-Flops for Accurate Multiphase Clocking: Transmission Gate Versus Current Mode Logic," by Ramen Dutta et al., IEEE Transactions on Circuits and Systems-II: Express Briefs, vol. 60, No. 7, Jul. 2013, pp. 422-426.
German Office Action, File No. 10 2015 216 637.6, Applicant: Dialog Semiconductor B.V., Mail date: Aug. 4, 2016, 6 pgs, and English language translation, 5 pgs.
"A Stack-Mode Low Power Prescaler in ISM Band ASK Receiver," by Liang Hong et al., 7th International Conference Proceedings on Solid-State and Integrated Circuits Technology, 2004, Oct. 18-21, 2004, pp. 1516-1518.
"A Novel Stacked Design of a LC VCO-Prescaler Combination in Sub-Micron PDSOI CMOS," by Ketan Mistry, 49th IEEE International Midwest Symposium on Circuits and Systems, 2006. MWSCAS '06, Aug. 6-9, 2006, pp. 664-668.
"A Current Reused Divided-by-two Frequency Divider," by Xiao Shi et al., Advanced Materials Research (vol. 660), pp. 119-123, Feb. 2013.

\* cited by examiner

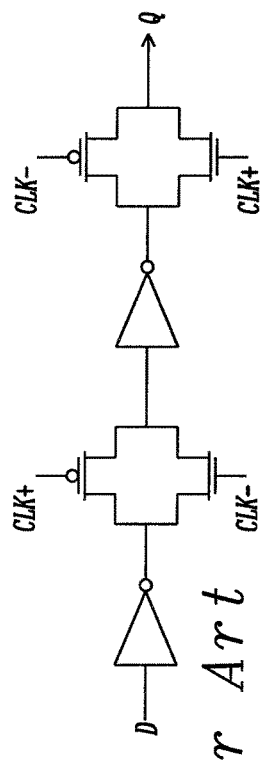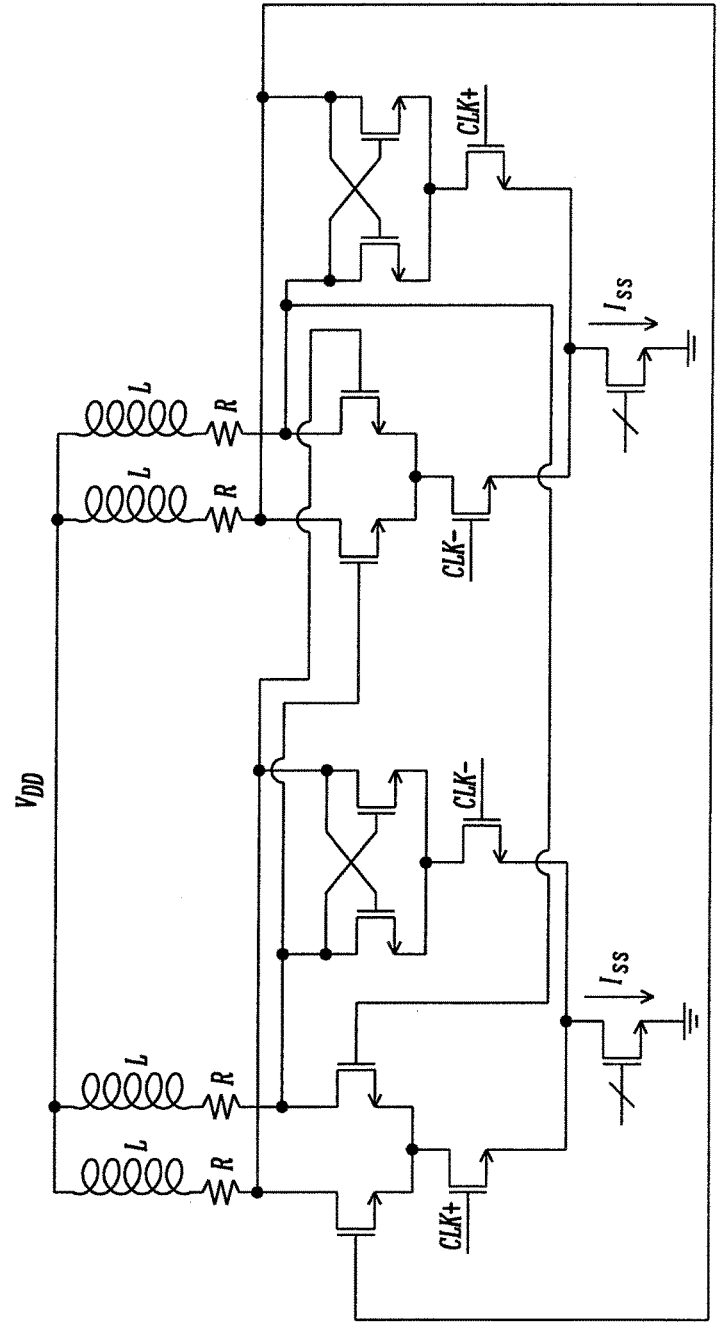
FIG. 3 Prior Art
FIG. 4 Prior Art

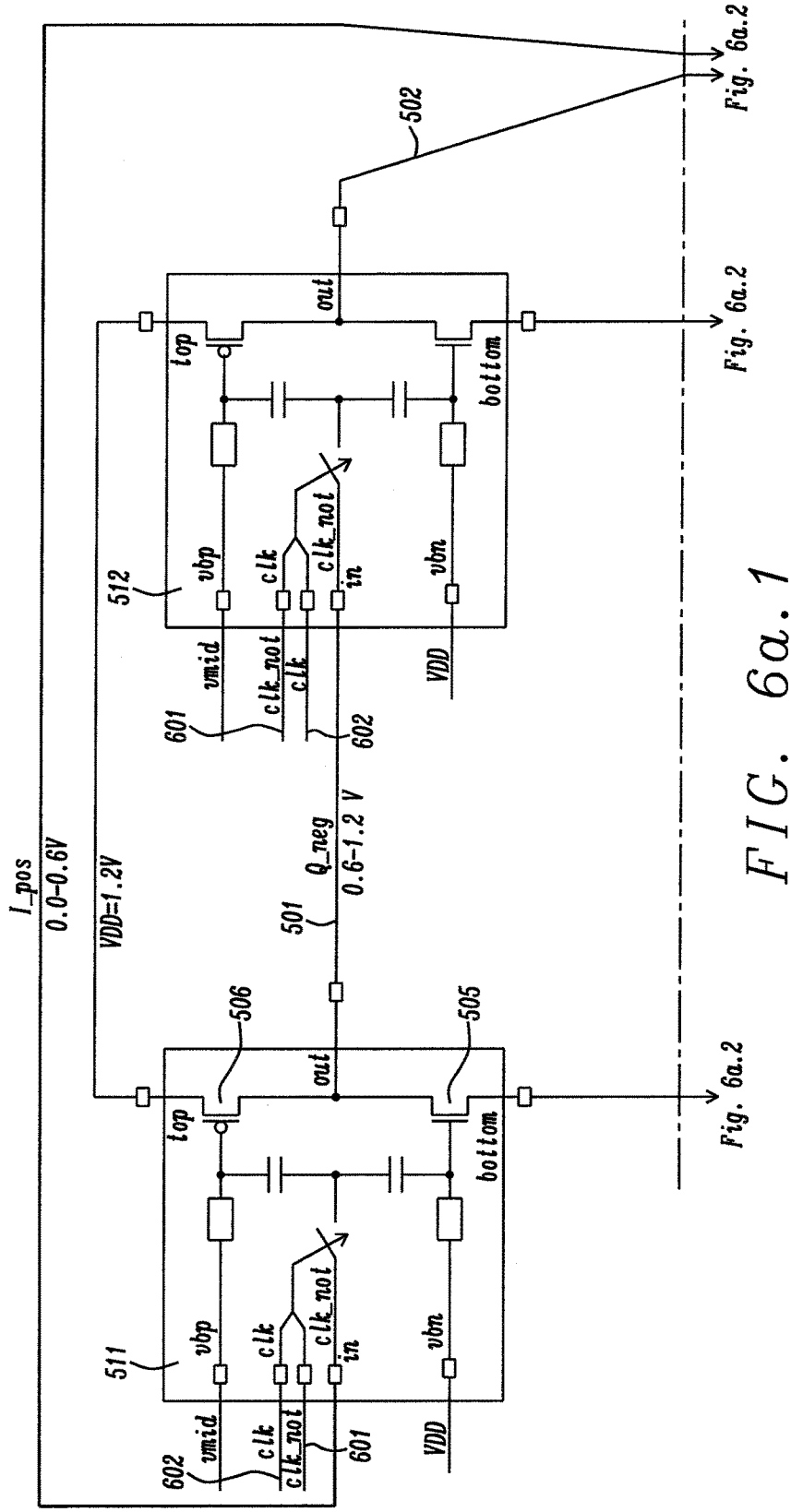
FIG. 6a.1

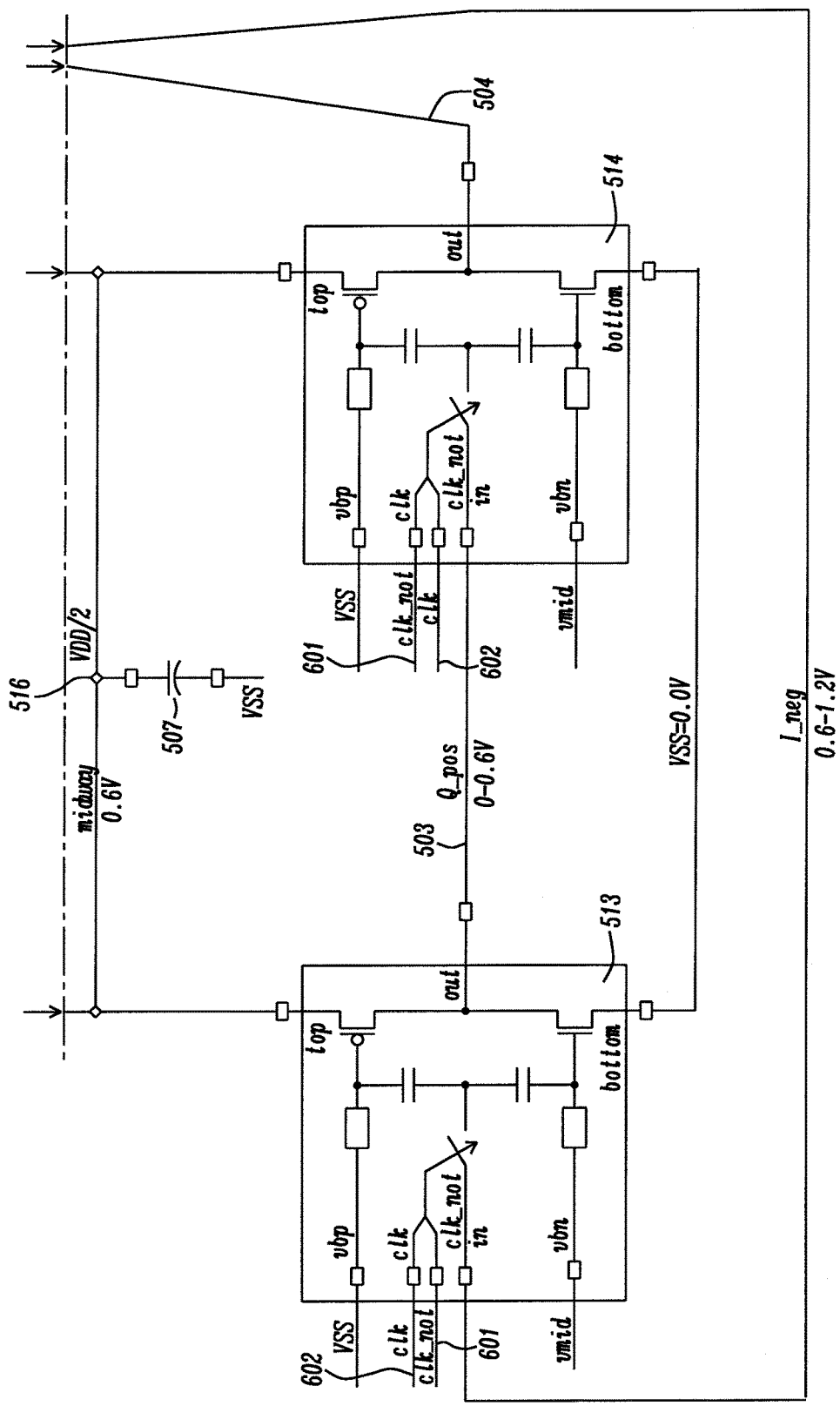
FIG. 6a.2

STACKED CLOCK-GENERATION CIRCUIT

TECHNICAL FIELD

The invention relates to a stacked clock-generation circuit.

BACKGROUND

In many modern integrated circuits (ICs), multi-phase clocks are often used for applications such as frequency division (PLLs), ADC and DAC interleaving, N-path filtering, zero-IF downconversion, harmonic rejection receivers and transmitters, switched-capacitor circuits and complex-domain analog signal processing. An example of a divide-by-4 circuit, which generates 4 clock phases, is shown in FIG. 1.

As important building blocks, the power consumption, chip area, phase noise performance, and frequency operating range are key characteristics of clock-generating circuits. Typically, a clock-generating circuit comprises a number of memory elements, such as latches and/or flipflops. These memory elements can be composed of, for example, standard or custom CMOS latches, dynamic transmission gate flipflops (DTGFFs), or current-mode logic (CML) latches with or without inductive load. Examples of these implementations are shown in FIG. 2, FIG. 3, and FIG. 4, respectively.

As can be observed, some flipflops have a differential input and/or differential output, and some use a differential clock. Differential signaling may be preferable in many ICs due to its ability to suppress common-mode disturbances from e.g. supply, ground, or neighboring circuitry.

Differential outputs are naturally available in CML, which can achieve high operating frequencies. However, these flipflops require a static current, and their current consumption is set according to the highest frequency at which they are supposed to operate. This implies a power penalty at lower operating frequencies. The power consumption can be reduced by employing inductors L instead of (or in addition to) load resistors R, see FIG. 4, but this limits the frequency range of operation and is highly prone to undesired magnetic coupling.

Park et al. "A 1.8 V 900 uW 4.5 GHz VCO and Prescaler in 0.18 um CMOS Using Charge-Recycling Technique", IEEE Microwave and Wireless Components Letts, vol. 19, no. 2, February 2009, discloses sharing the CML-current with the oscillator current to circumvent the additional current, but uses significantly more voltage headroom, more than is typically available in modern CMOS-processes.

Regenerative dividers, such as proposed in Mazzanti et al. "Analysis and Design of Injection-Locked LC Dividers for Quadrature Generation", IEEE J. Solid-State Circ., vol. 39, no. 9, September 2004, rely on non-linearities combined with a narrowband band-pass filter and feedback to create multi-phase outputs at lower frequencies. However, the creation of narrowband filtering typically uses large inductors with their associated disadvantages, or noisy and power-hungry components defying the power advantage of a regenerative divider.

Dutta et al. "Flip-Flops for Accurate Multiphase Clocking: Transmission Gates Versus Current Mode Logic", IEEE Trans. Circ. Syst. I, vol. 60, no. 7, July 2013 describes that it can be more power-efficient to generate multi-phase outputs using DTGFFs. For example, for each phase, it can have two transmission gates (TGs) that are driven by a clock, and two inverters which operate rail-to-rail, as illustrated in FIG. 3.

SUMMARY

An aspect of the invention is to reduce the power consumption of frequency dividers.

An aspect of the invention is to lower the voltage headroom used by a component of a frequency divider without the use of additional complex components such as a low-dropout regulator (LDO) or DC-DC converter, while maintaining performance.

An aspect of the invention is to provide an electronic circuit for dividing a clock signal, the electronic circuit comprising a plurality of memory elements, each memory element comprising an input terminal, an output terminal, a top voltage terminal, a bottom voltage terminal, and a clock terminal, wherein at least one of the memory elements is arranged with its output terminal coupled to the input terminal of another memory element wherein the electronic circuit is configured to generate an output signal having a smaller fundamental frequency than the clock signal at at least one of the output terminals;

wherein each memory element is configured to change and hold a voltage at the output terminal based on a voltage at the input terminal at times controlled by a clock signal received at the clock terminal, by drawing a charge from the top voltage terminal to the output terminal or drain the charge from the output terminal to the bottom voltage terminal; and wherein at least two of the memory elements are stacked in the sense that the bottom terminal of a first memory element is connected to the top terminal of a second memory element to enable the charge to flow from the first memory element to the second memory element.

The inventors have realized that to reduce power consumption of a clock divider, it may be useful to reduce the voltage of the supply power used by the clock divider. However, components generally used to provide reduced power supply are by themselves relatively complex and consume power and significant chip area. By stacking several memory elements of the clock divider, the supplied voltage is divided into at least a potential difference over the top voltage terminal and the bottom voltage terminal of the first memory element and the potential difference over the top voltage terminal and the bottom voltage terminal of the second memory element. This leads to significant reduction in power dissipation in those memory elements.

The electronic circuit may further comprise a storage element, such as a capacitor, a first terminal of the storage element connected to the bottom voltage terminal of the first memory element and a top voltage terminal of the second memory element, the storage element configured to store the charge retrieved from the first memory element and provide the charge to the second memory element, wherein the storage element is configured to maintain a voltage in between the top voltage supply and the bottom voltage supply. This can help to provide a more constant voltage at the top voltage terminals and bottom voltage terminals.

The first terminal of the storage element may be connected to a plurality of bottom voltage terminals of a plurality of first memory elements and top voltage terminals of a plurality of second memory elements. The storage element may be configured to store the charge retrieved from the first memory elements and provide the charge to the second memory elements. This can help to simplify the design and/or provide more constant voltage at the terminals.

At least one of the memory elements may comprise an internal node which is, optionally via further circuitry, connected to the input terminal, and a transistor whose drain or source is connected to the top voltage terminal or the bottom voltage terminal, and whose gate is connected via a direct current (DC) biasing circuit to a bias voltage source, and via an alternate current (AC) coupling circuit to the internal node. Such a DC bias circuit and AC coupling of the transistor to the internal node help to adapt the gate voltage to the characteristics of the transistor. For example, due to the reduced voltage over the top and bottom terminals, the voltage at the input terminal and output terminal may vary with a smaller amplitude than in the prior art design.

In a particular example, the source of the transistor is connected to the top voltage terminal or the bottom voltage terminal. In another particular example, the drain of the transistor is connected to the output terminal. In another example, comprising both the transistor whose drain or source is connected to the top voltage terminal and the transistor whose drain or source is connected to the bottom voltage terminal, different bias voltages can be supplied to both transistors.

The memory elements can be dynamic or static latches or dynamic or static flipflops, for example.

One or more, or each, memory element may further comprise a transmission gate configured to vary a conductance between the input node and an internal node of the memory element, based on a clock signal received at the clock terminal and at the same frequency as the clock signal; and an inverter connected to the top voltage terminal and the bottom voltage terminal and configured to provide an inversion of a voltage at the internal node at the output terminal, wherein the inverters of said at least two memory elements are stacked. This is a suitable example implementation of the memory elements.

The memory elements may be arranged with their output terminal coupled to the input terminal of another memory element to form a closed loop of memory elements configured to generate an output signal having a smaller fundamental frequency than the clock signal at at least one of the output terminals. This is a suitable configuration of a clock divider using the stacked memory elements.

According to another aspect of the invention, a method to reduce the power consumption of a clock-dividing circuit by applying charge-sharing/reuse is provided. The method comprises the steps of:

providing a plurality of memory elements, each memory element comprising an input terminal, an output terminal, a top voltage terminal, a bottom voltage terminal, and a clock terminal, arranging at least one of the memory elements with its output terminal connected to the input terminal of another memory element arranging the electronic circuit to generate, in operation, an output signal having a smaller fundamental frequency than the clock signal at at least one of the output terminals;

configuring each memory element to change and hold a voltage at the output terminal based on a voltage at the input terminal at times controlled by a clock signal received at the clock terminal, by drawing a charge from the top voltage terminal to the output terminal or drain the charge from the output terminal to the bottom voltage terminal; and stacking at least two of the memory elements by connecting the bottom terminal of a first memory element to the top terminal of a second memory element to enable the charge to flow from the first memory element to the second memory element.

The person skilled in the art will understand that the features described above may be combined in any way deemed useful. Moreover, modifications and variations described in respect of the electronic circuit may likewise be applied to the method, and vice versa.

BRIEF DESCRIPTION OF THE DRAWINGS

In the following, aspects of the invention will be elucidated by means of examples, with reference to the drawings. The drawings are diagrammatic and are not drawn to scale. Some similar or related items have been labeled with the same reference numeral in the drawings.

FIG. 3 shows a prior art dynamic transmission gate flipflop (DTGFF).

FIG. 4 shows a prior art current-mode logic (CML) divider.

FIG. 6a.1 shows a divide-by-2 circuit topology.

FIG. 6a.2 shows a continuation of FIG. 6a.1.

FIG. 7b shows signals occurring in the circuit of FIG. 7a.

DESCRIPTION

Figure 1:
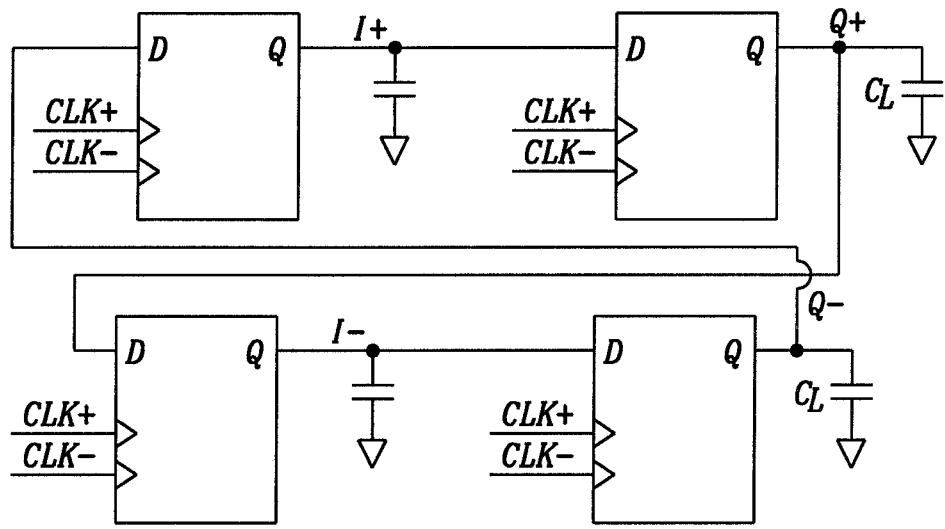
FIG. 1 shows a prior art divide-by-4 circuit.
Figure 2:
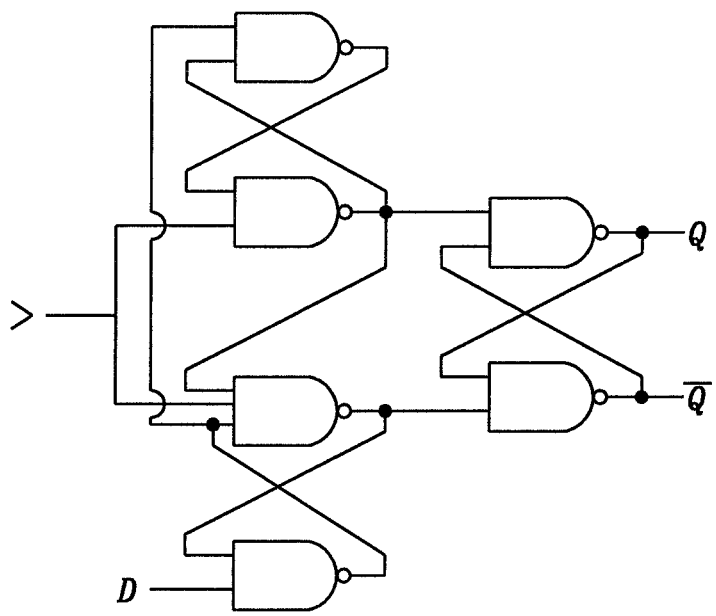
FIG. 2 shows a prior art static complementary metal oxide semiconductor (CMOS) flipflop.

In the following description, a number of example embodiments will be described in detail. However, the description of these embodiments is not intended to limit the scope of protection. Also, examples of particular circuits and components of the electronic device will be described in the following. However, it is noted that in view of the present disclosure, the techniques described in respect thereto may be applied in a similar way using alternative or modified techniques.

Moreover, it should be noted that the disclosure is not only applicable to metal oxide semiconductor (MOS) technology but also to all other technologies wherein one port is used to control current flow through other ports, such as e.g. bipolar, junction gate field-effect transistor (JFET), and other technologies.

Further, in the following description the emphasis is on latches and flipflops as main components of the divider. However, the techniques disclosed herein may be applied similarly to flipflops and latches. Consequently, whenever the word latch is used, the similar technique may be applied to flipflops, and when the word flipflop is used, the similar technique may be applied to latches. Moreover, the techniques may be applied to memory elements in general. These memory elements may be dynamic or static memory elements. Latches and flipflops are used in the description as examples of memory elements.

By stacking two memory elements, such as flipflops or latches, the supply voltage across each flipflop or latch is effectively halved. This can help to reduce the power consumption of each flipflop or latch, in some cases up to a factor 4. Moreover, the charge of the top flipflop/latch in the stack is not dumped to ground, but can be reused by the bottom flipflop/latch. This reduces power consumption, in some cases up to another factor 2. The scheme can be generalized (with even more potential power-savings) by stacking more than 2 flipflops/latches.

Frequency generation is responsible for a large part of the total power consumption of extremely low-power circuits, such as low-power communication circuits. By reducing the divider power consumption, the overall power consumption can be reduced significantly. When stacking components, each component sees a lower supply voltage. In this way, dedicated circuitry, such as an LDO or DC-DC-converter, can be avoided. It allows components to operate at the lowest voltage possible, or, the other way around, allows a supply voltage higher than each component would need or could sustain. This concept can be beneficial, for example, when the device is interfaced to batteries, solar panels, or other energy sources.

An N-phase clock generation circuit can comprise N or 2N (near-identical) circuits. For example, the DTGFF in FIG. 3 consists of two dynamic latches, each of which itself consists of a transmission gate plus an inverter. These latches may or may not be equally sized. In any case, stacking these circuits can reduce their power consumption.

Figure 5:
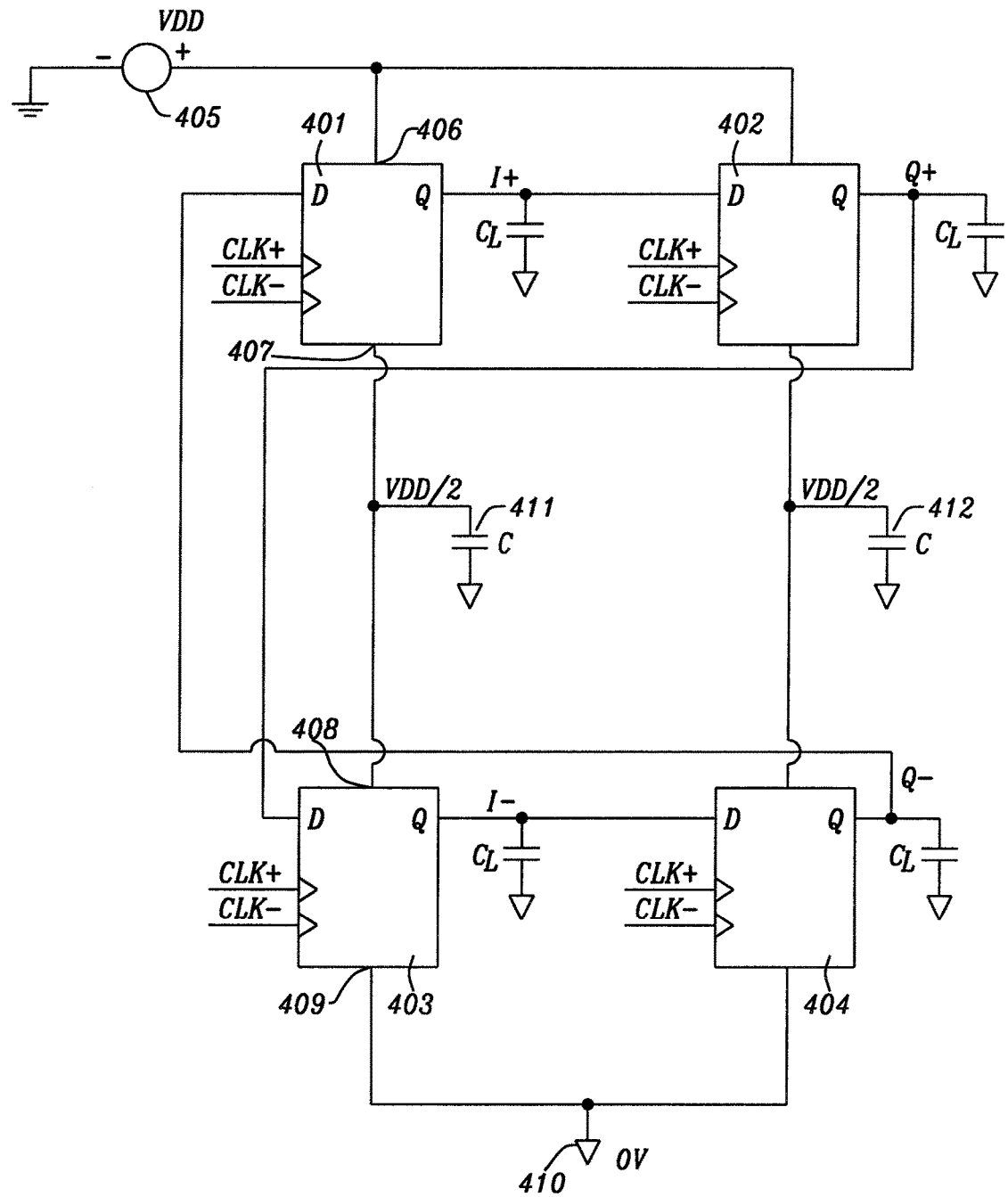
FIG. 5 shows a divide-by-4 circuit topology.

FIG. 5 shows an example schematic of a 2-stacked IQ-divide-by-4 circuit. In this particular example, each memory element 401, 402, 403, 404 is a complete flipflop. However, this is not the case in all embodiments, as the principle of stacking may be employed to different kinds of memory elements. As illustrated in the figure, a plurality of flipflops 401, 403 are stacked so that they are connected to a power supply 405 in series. The clock signals CLK+ and CLK− and the signal received at the D terminal control the output signal at the Q terminal of each flipflop 401, 402, 403, and 404. The power terminals of each flipflop are connected to the power source or ground, or to the power terminal of another flipflop in the stack. In the latter case, a storage element such as a capacitor may be provided to temporarily store the charge flowing from one flipflop to the other flipflop. For example, top voltage terminal 406 of flipflop 401 is connected to the power source 405, and bottom voltage terminal 407 of flipflop 401 is connected to top power terminal 408 of flipflop 403, and optionally also to optional capacitor 411. Bottom voltage terminal 409 of flipflop 403 is connected to ground 410. Flipflop 402 and flipflop 404 form a second, similar stack which is connected to the power supply and ground in parallel to the stack formed by flipflops 401 and 403. For example, the power source 405 provides a voltage VDD of 1.2 volts, and the voltage at the connection between flipflops 401 and 403 (and capacitor 411) is half the voltage supplied by the power source 405, VDD/2, for example 0.6 volts. The output terminal (Q) of each flip-flop is connected to the input terminal (D) of the next flip-flop. Capacitor $C_L$ indicates an optional capacitance connected on one end to the Q and D terminal and on the other end to ground. The phase of the signal at the output terminal (Q) is changed compared to the phase of the signal at the input terminal (D) of each flip-flop. This change of phase is controlled by the clock terminals (CLK+ and CLK−). This way, flipflop 401 generates an I+ signal (phase of 0 degrees), flipflop 402 generates a Q+ signal (phase of 90 degrees), flipflop 403 generates an I− signal (phase of 180 degrees), and flipflop 404 generates a Q− signal (phase of 270 degrees).

In the embodiment of FIG. 5, as well as in the other example embodiments disclosed herein, the output terminal (e.g. Q) of one of the memory elements (e.g. flipflop 401) is connected to the input terminal (e.g. I) of another one of the memory elements (e.g. flipflop 402). This connection can be a direct connection or a connection via further circuitry. In some example embodiments the input and output terminals of the memory elements are connected in such a way that a group of memory elements are interconnected in a circular fashion.

It will be understood that the memory elements may be implemented and organized in many different ways. As illustrated in FIG. 1 to FIG. 4, different designs of frequency dividers have different memory elements that are interconnected differently. However, the concept of stacking can be applied to those different frequency dividers.

FIG. 6a.1 shows an example schematic for a frequency divide-by-2 circuit, or equivalently, a 4-phase clock generation circuit, employing the technique disclosed herein by stacking two DTG latches. The transmission gates inside latches 511, 512, 513, 514 are schematically shown as switches here, and are driven by the input clock. The clock buffers and transistor DC-bias voltage generation may be present but are not shown. The inverters of the latches 511, 512, 513, 514 in this example comprise an NMOS transistor 505 and a PMOS transistor 506. The transistor gates are DC-biased for proper operation, but this may not always be necessary.

The way the different inverters are stacked may be changed. Other components may be added to these stacks as well. In FIG. 6a.2, the intermediate node 516, indicated by VDD/2, will, due to symmetry, automatically settle to half the supply voltage in this example.

As indicated in FIG. 5, the different stacks may have separate flow between VDD and ground, with separate optional capacitors 411, 412 to store the charge dumped by the top flip-flop 401, 402 before the charge is provided by the bottom flip-flop 403, 404 of the stack. However, as shown in FIG. 6A.2, the stacks can be connected at the intermediate voltage level by means of a single intermediate node 516, with one optional capacitor 507 that stores charge dumped by any of the top latches 511, 512 and provides charge to any of the bottom latches 512, 514. The additional capacitance 507 (or in FIG. 5, capacitances 411 and 412) may be provided for stabilizing the node or for non-differential operation, stacking the units of the circuitry in a way that, if an output potential of a latch is to be lowered, a charge flowing out of the output node of this latch is either used right away to lift an output node of a lower latch, or flows into a storage element, such as a capacitor, for subsequent use depending on input signals of the latches. Other circuitry may be attached to this intermediate node 516 (or to intermediate nodes at capacitors 411, 412 in FIG. 5) when considered useful. When the top and bottom parts are not operating in a differential way, the extra capacitor helps to temporarily store the charge that will be dumped by the top latch 401 sometime before the bottom latch 403 will consume the charge again, such that the intermediate voltage remains more stable. Note that the divider may be implemented in a resonant or non-resonant way, just as is possible in non-stacked implementations.

Figure 6B:
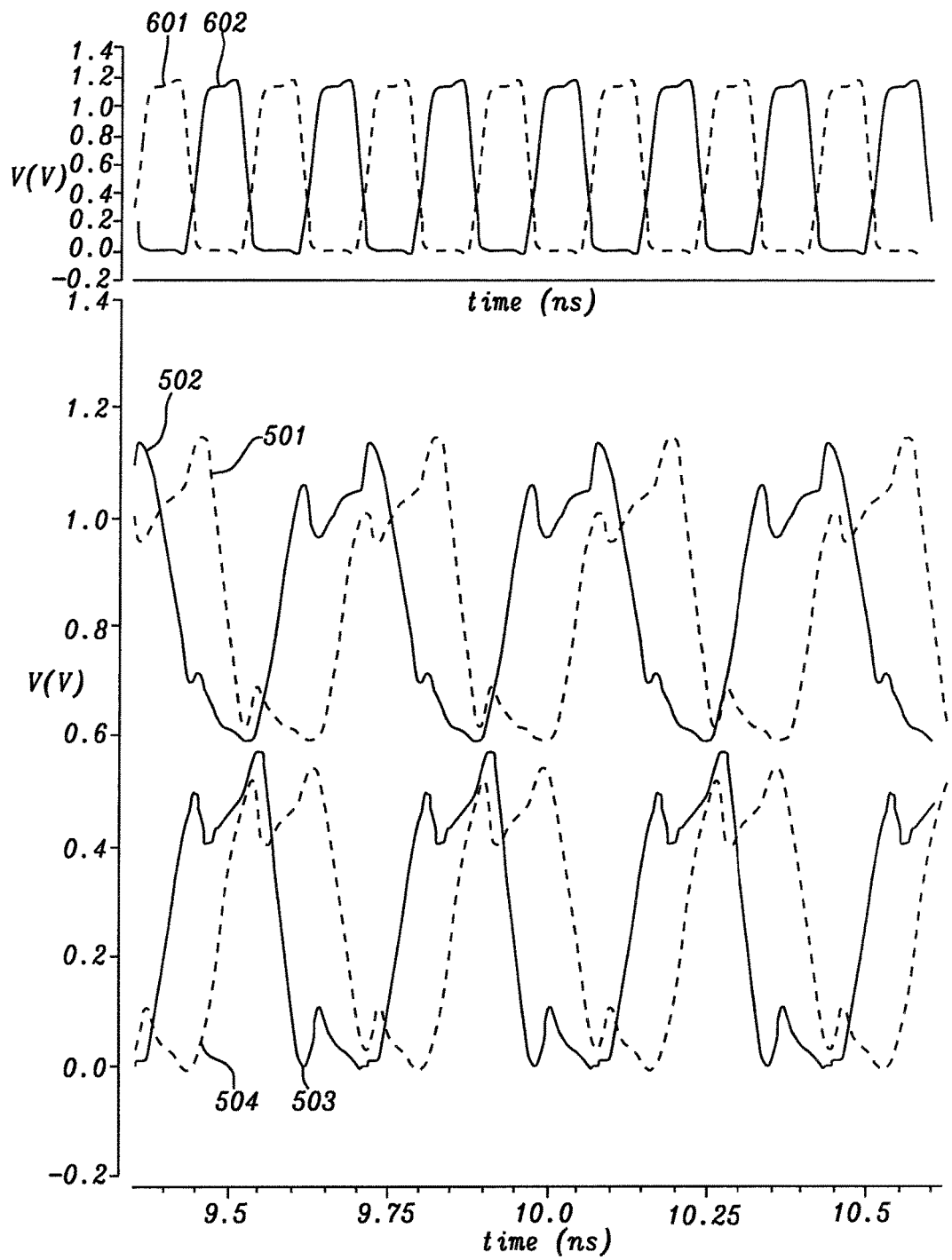
FIG. 6b shows signals occurring in the circuits of FIGS. 6a.1 & 6a.2.

In the schematic of FIG. 6a.1, the implementation is non-resonant, with a rail-to-rail clock input. FIG. 6B illustrates the waveforms of the two clock signals, 601 and 602, which are (pseudo-)differential clock signals, which are applied to the correspondingly marked clock input terminals of the latches. The vertical axes represent potential difference in volts with respect to VSS. The horizontal axis represents time in nanoseconds. FIG. 6B further shows example output signals 501, 502, 503, 504 generated at the correspondingly marked positions of FIG. 6a.1.

Figure 7A:
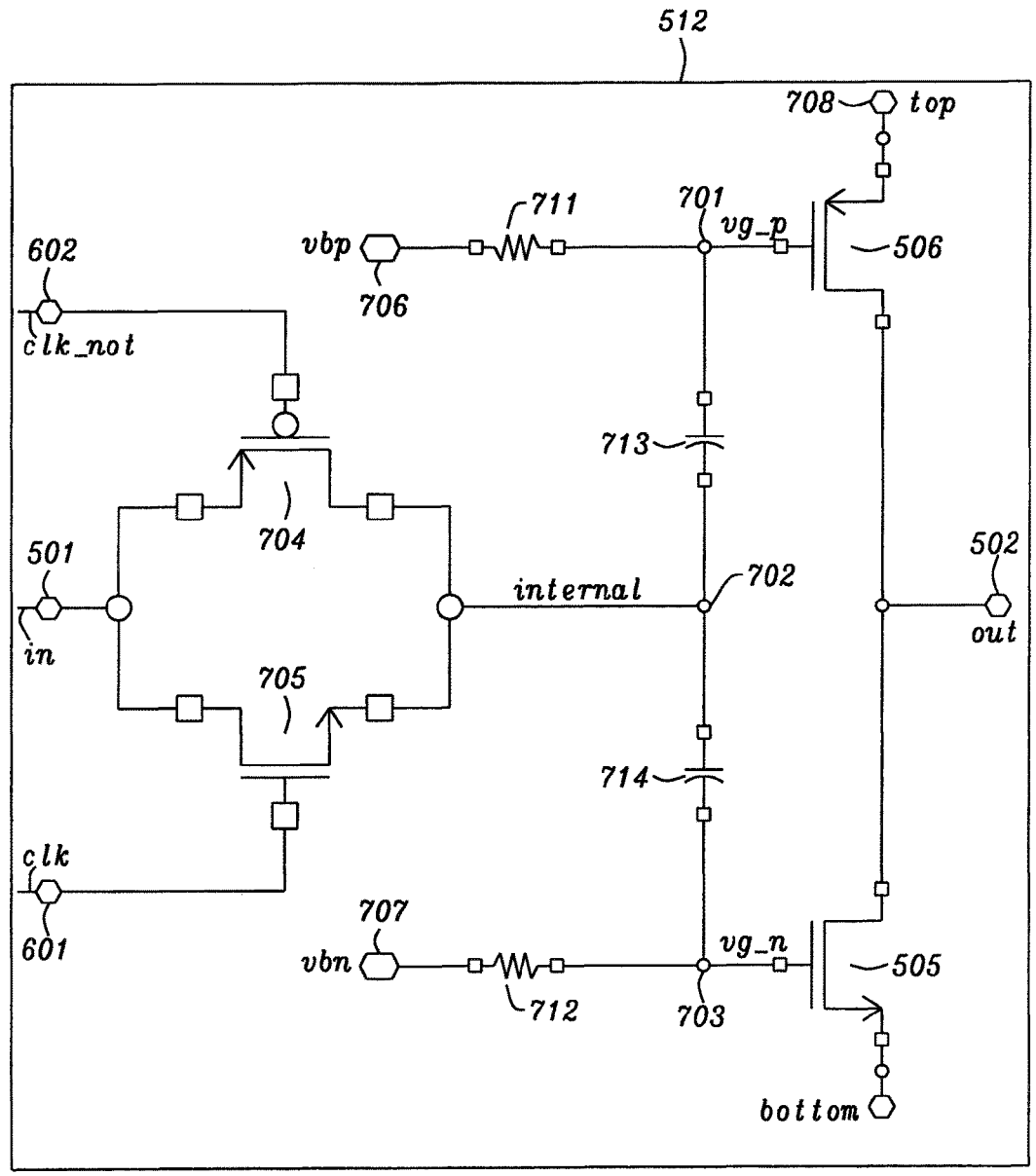
FIG. 7a shows a memory element of the circuits of FIGS. 6a.1 & 6a.2.
Figure 7B:
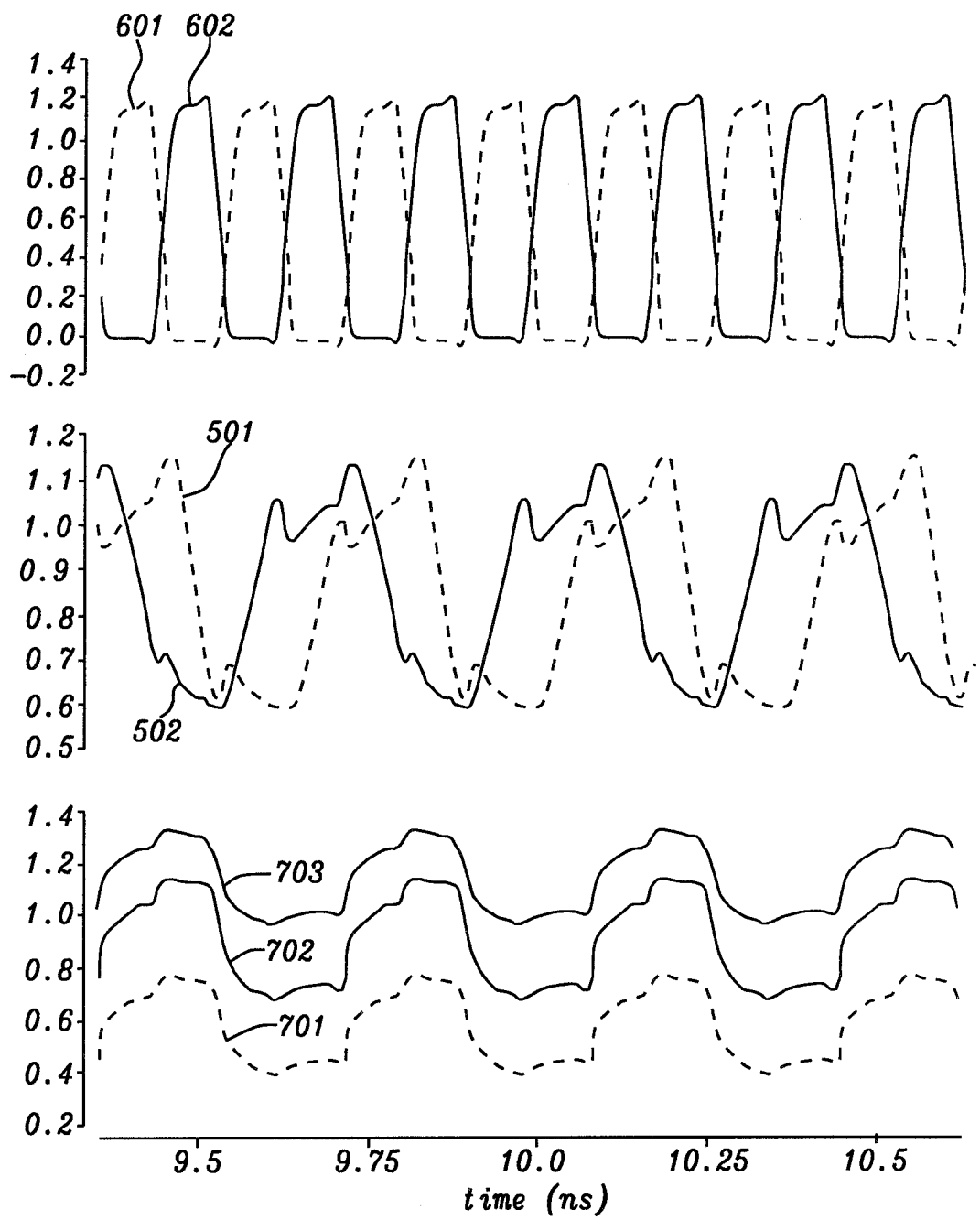

The schematic of each dynamic latch 511, 512, 513, 514 is shown in greater detail in FIG. 7a, with FIG. 7b showing corresponding waveforms for the top-right latch 512 of FIG. 6a.1. The vertical axes represent potential difference in volts with respect to VSS. The horizontal axis represents time in nanoseconds. FIG. 7b shows again clock signals 601 and 602 applied to CLK terminal 601 and CLK_NOT terminal 602, respectively. In the other latches, the arrangement of CLK and CLK_NOT may be reversed, as illustrated in FIG. 6a.1.

The principle of operation of a latch of such an example divider will be described hereinafter with reference to FIG. 7a and FIG. 7b.

The latch comprises a transmission gate. This transmission gate comprises a first transistor 705 the gate of which is connected to the clock terminal 601, and a second transistor 704 the gate of which is connected to the negative clock terminal 602, the first transistor 705 and the second transistor 704 being connected in parallel to the input terminal 501 and the internal node 702. Other implementations of the latch may be different, i.e., without using a transmission gate. Also, the transmission gate, when present, may be implemented differently than the example shown in FIG. 7a.

Referring to FIG. 7a, as long as the clock signal 601 is low (i.e. below VDD/2 which can be, depending on the technology used, roughly the threshold voltage $V_{th}$ of the NMOS 705), the transmission gate 704,705 is not conducting: the input 501 may change in whatever way, but the voltage of the internal node 702 remains as it is (since the leakage is low and the operating frequency is high). As soon as the clock signal 601 goes high (and clock signal 602 goes low), which happens at the start of the waveforms shown at around 9.35 ns in FIGS. 6b and 7b), the transmission gate 704,705 starts conducting, and the internal node 702 will (dis)charge to reach the voltage at the input terminal 501. This change in voltage, dV/dt, will also be present at nodes vg_p 701 and vg_n 703, as illustrated by the corresponding waveforms 701 and 703 in FIG. 7b.

The latch may comprise a DC bias to adjust the voltage applied to the gate terminal of a transistor of the latch. For example, one or both of the transistors 506 and 505 may have such a bias. In the illustrated example, both transistors 506 and 505 have a bias 706 and 707, respectively. The bias adjusts the voltage at the internal node 702, which is received from the input terminal 501, so that the voltages applied to the gate of each transistor 506, 505 swing around their respective threshold voltages. Due to the AC-coupling of the input nodes 501, and the DC-bias voltages applied to them (e.g. 0.6V supplied at 706 for the PMOS 506, 1.2V supplied at 707 for the NMOS 505), there is a constant DC-offset between the three nodes 701, 702, and 703, but dV/dt is (almost) the same in all three of them. An example to achieve this is by means of the resistors 711 and 712 (which can be, for example 20 kΩ), and capacitors 713 and 714 (which can be, for example, 75 fF). The node 701 connects the gate of transistor 506 via resistor 711 to the bias voltage source 706, and via capacitor 713 to the internal node 702. The node 703 connects the gate of transistor 505 via resistor 712 to bias voltage source 707, and via capacitor 714 to the internal node 702.

For example, if the input terminal 501 has a high voltage when the transmission gate starts conducting, the internal node 702 will charge. The change in voltage is enough to turn off the PMOS 506, and turn on the NMOS 505, which means the output voltage 502 will go down towards the bottom voltage, which in this case is determined by node 506, marked VDD/2 in FIG. 5. This is indeed what the waveform 502 does. Note that the clock signal 601 has already gone down again at 9.45 ns, such that the transmission gate 704, 705 is not conducting anymore: the voltage on the internal node 702 will remain as it is (since the leakage is low and the operating frequency is high), until the clock 601 becomes high again to turn on the transmission gate 704, 705.

The next time the clock 601 goes high (at 9.55 ns), the input voltage 501 is much lower, such that the opposite events of the previous cycle happen: the internal node voltage 702 goes down, pulling with it the vg_p voltage 701 and the vg_n voltage 703. This turns on the PMOS 506 and turns off the NMOS 505, such that the output voltage 502 goes towards the top voltage 708, which is VDD in this case. Again, this can be observed in the waveform 502 in FIGS. 6b and 7b.

It can be observed that the output voltage 502 changes value every time after a rising clock edge of the clock 601 (and a corresponding falling clock edge of the inverse clock 602). Effectively, the output frequency of the output signal 502 is halved compared to the clock 601. Each of the 4 dynamic latches 511, 512, 513, 514 operates in this way, and their configuration in a ring with respect to their input 501 and output 502 ensures that a quadrature divide-by-2 signal is generated.

The divider illustrated in FIGS. 6a.1, 6a.2 and FIG. 7a can be properly initialized to cause it to generate the desired output waveforms 501, 502, 503, and 504. This startup or initialization can be implemented in many ways, such as a dynamic initialization of the node voltages, or an additional divider which is only turned on at the beginning and which is implemented such that it does not need initialization.

The latter solution, an additional divider which initializes itself, is a simple and quite robust solution for initialization of the circuit illustrated in FIG. 6a.1. Since there are no constraints on matching and noise performance, the additional divider only needs a small area. Its power overhead is insignificant as it is only used for a short period of time at startup. One of the outputs of the additional divider is connected to one of the four phases (501, 502, 503, or 504) in the divider of FIG. 6a.1, to force a voltage on that node. After a short initialization period of e.g. a few nanoseconds, the signals generated at 501, 502, 503, and 504 are as illustrated in FIG. 6b, and the additional divider can be switched off so that it does not consume any energy. The additional divider can be a self-initializing circuit, for example utilizing DTGFFs in a way known in the art per se.

Figure 8:
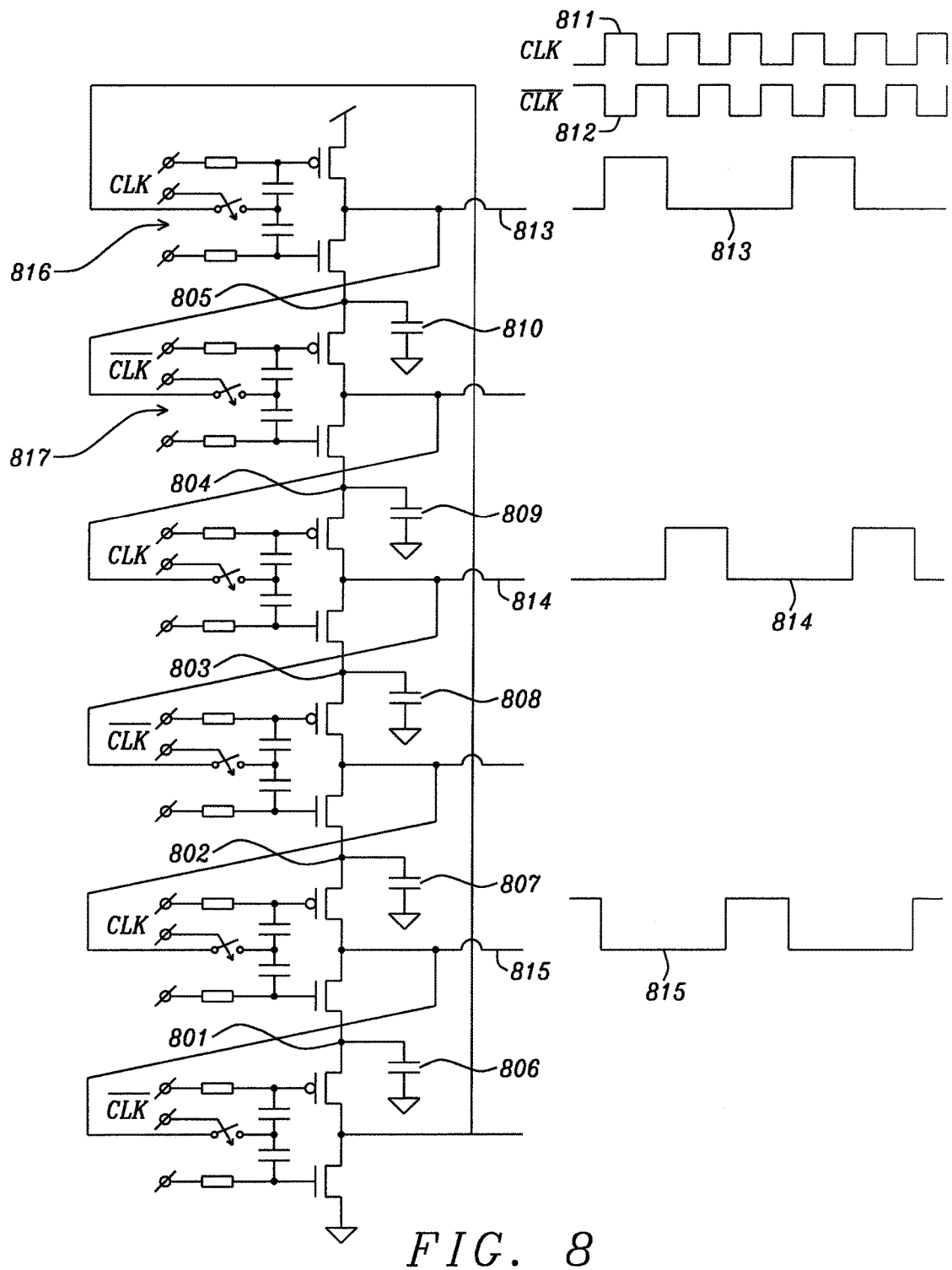
FIG. 8 shows a divide-by-3 circuit topology.

This concept can be extended, for example to increase the division ratio and the phase generation by stacking more latches. As explained before, more power can in principle be saved by stacking more latches. An example for 3-phase generation is shown in FIG. 8, where it is assumed that all latches are identical. In that case, the voltages at the intermediate nodes 801 to 805 will be at k/6*VDD, for k=1, . . . , 5, respectively. The circuit also works if the two latches 816, 817 inside a flipflop are differently sized, in which case the voltages at the intermediate nodes 801 to 805 will be distributed differently, depending on the sizing. Herein, the latches may be similar to e.g. the latch shown in FIG. 7a. A flipflop may comprise two consecutive latches, which are clocked in anti-phase. For example, in FIG. 8, the upper two latches 816, 817 form one flipflop (one latch 816 is clocked by CLK, the other latch 817 is clocked by CLK_NOT).

Figure 9:
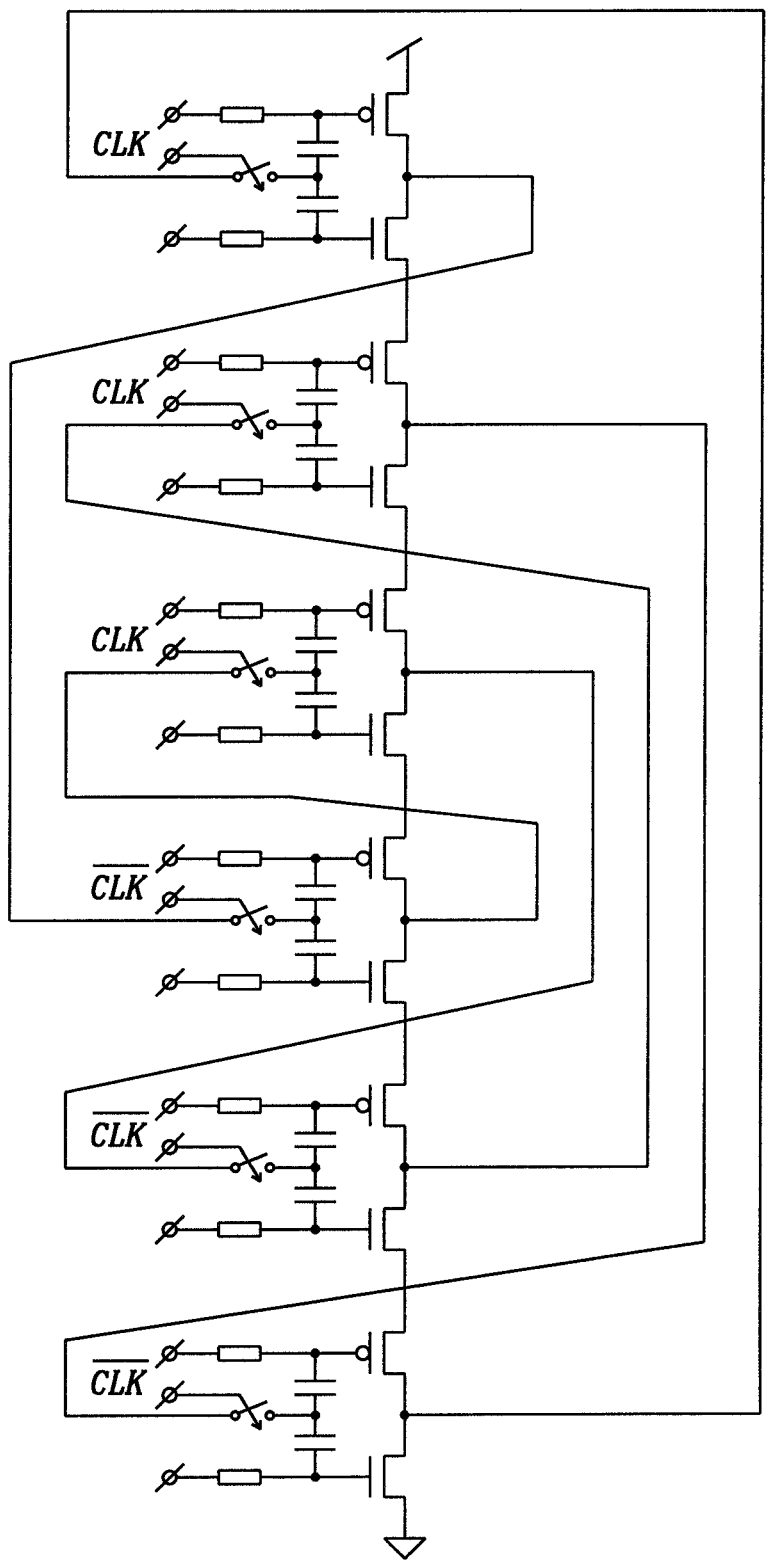
FIG. 9 shows another divide-by-3 circuit topology.

Optional additional capacitances 806 to 810 at the intermediate nodes 801 to 805, respectively, are shown in the figure. Indicative waveforms of the clock 811 and 812, and three phase outputs 813, 814, and 815, are also shown. Note that the order in which the latches/flipflops are stacked with respect to the voltage source VDD and ground VSS, can be arbitrarily changed. For example, another arrangement is shown in FIG. 9.

The output swing of a stacked divider is identical to the internal swings, which means it is not rail-to-rail/full-swing from 0 to VDD. In FIG. 6B, it is illustrated that the output signals 503 and 504 vary roughly from 0 to VDD/2, while output signals 501 and 502 vary roughly from VDD/2 to VDD, wherein VDD is about 1.2 volt. In analog/RF applications, it is often not needed or undesirable to go (back) to full-swing levels. For example stacked buffers (as e.g. explained in U.S. Pat. No. 8,884,662 B2) can interface perfectly well with a stacked divider output without going rail-to-rail. Other analog/RF circuits, such as Gilbert-mixers or CML-logic (current-mode logic) also do not need, and sometimes don't even work properly, with rail-to-rail input signals.

For digital applications, there can be some point in the device where one wants to go back to full-swing. The interface could be implemented as a simple AC-coupled inverter, with the PMOS and NMOS gates separately biased at roughly the threshold voltage. Such an arrangement can provide rail-to-rail output swing, which means the design/power overhead is very low. An additional advantage is that the trajectory from the divider output all the way to the circuitry where rail-to-rail signals are finally needed (which can be several millimeters away), the signal swing is much lower, which can save significant power in charging the interconnect parasitics, and can reduce crosstalk to other lines.

The examples described above in detail can be extended by the person skilled in the art to other clock dividers that comprise memory elements that can be stacked. For example, a latch can contain an inverter that can be stacked with the inverter of another latch. When the memory elements are interconnected, the interconnection can be modified by providing an AC coupling in combination with a DC bias, as described above in relation to FIG. 7a and numerals 706, 711, 701, 713, 702, 714, 703, 712, and 707. This way, the voltages can be adjusted.

An original implementation of a frequency divider may be transformed into a stacked implementation as follows. First, identify the memory elements in the original implementation. For example, identify a first memory element and a second memory element. Then, stack the memory elements by connecting the top voltage terminal of the first memory element to a power supply (e.g., VDD), the bottom voltage terminal of the first memory element to the top voltage terminal of the second memory element, and the bottom voltage terminal of the second memory element to a VSS or ground. AC-couple all lines going from a component in the first memory element to a component in the second memory element. Additionally, AC-couple all lines going from a component in the second memory element to a component in the first memory element.

Optionally, the input clock may be AC-coupled as well. However, this is not always needed. The input clock may be a differential input clock or a single-ended input clock.

Figure 10:
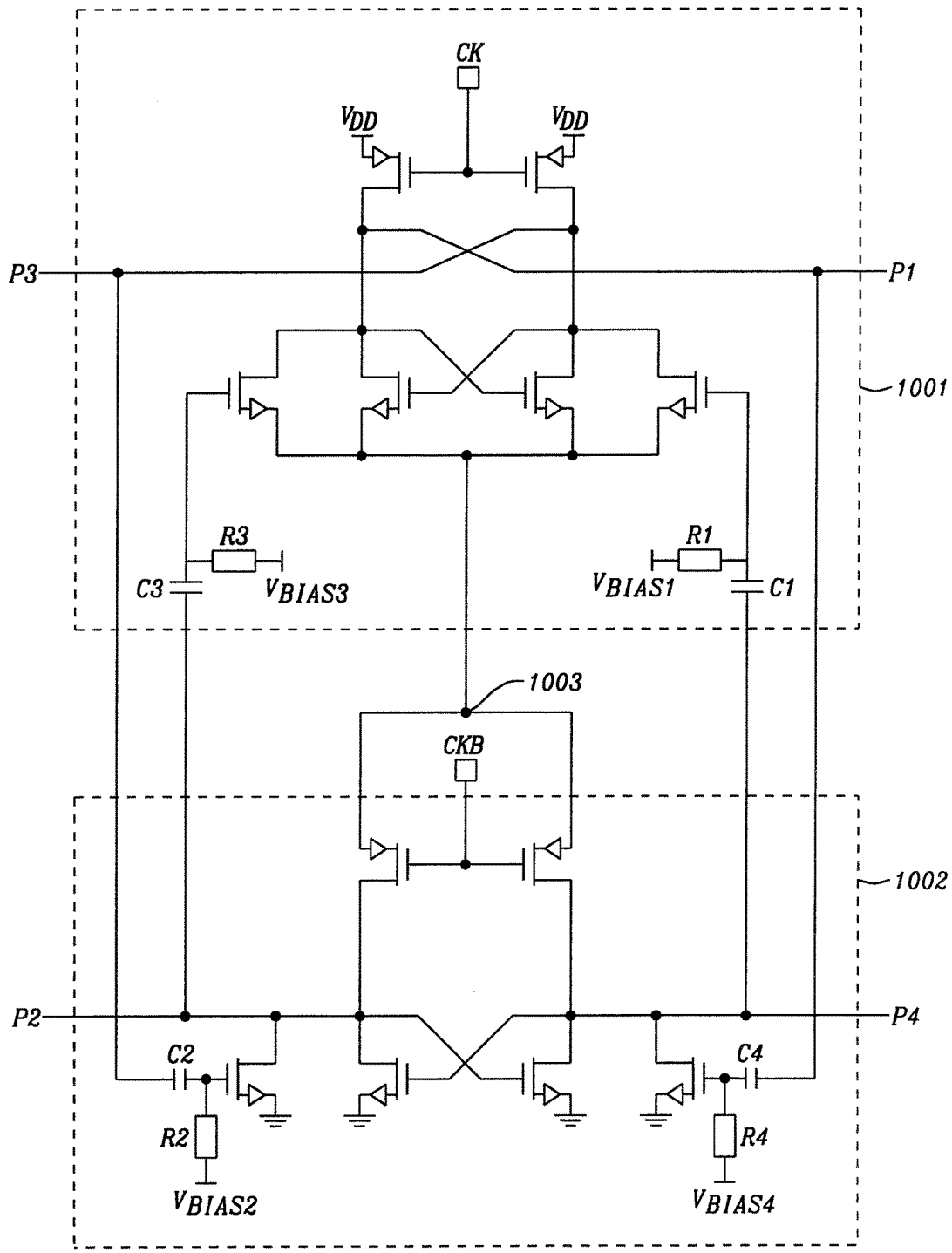
FIG. 10 shows another stacked divide-by-2 circuit topology.

An example of another implementation is illustrated in FIG. 10. Latch 1001 and latch 1002 have been stacked between the voltage supply VDD and ground via intermediate node 1003. The signal lines between the two latches have been provided with capacitive coupling (C) and bias voltage $V_{BIAS}$ with resistor R. As indicated, the values of these resistors, bias voltages and capacitors may be different for each capacitive coupling. This example implementation has differential latches instead of the single-ended latches used in the implementation with DTGFFs that was presented above. When the transistors are manufactured for a nominal 1.2 V supply, the supply voltage VDD can be 2.4 V. By appropriate configuration of the transistor sizes and bias voltages, the circuit may be made operational at VDD of 1.2V. This circuit may properly initialize by itself.

A method to provide a clock-dividing circuit with reduced power consumption is implemented as follows. First, a plurality of memory elements is provided. Each memory element comprises an input terminal, an output terminal, a top voltage terminal, a bottom voltage terminal, and a clock terminal. At least one of the memory elements has its output terminal coupled to the input terminal of another memory element. The electronic circuit is arranged to generate, in operation, an output signal having a smaller fundamental frequency than the clock signal at at least one of the output terminals. This step involves configuration of the memory elements and clock terminals, input and output terminals to obtain this effect, in a way known in the art per se. Each memory element is configured to change and hold a voltage at the output terminal based on a voltage at the input terminal at times controlled by a clock signal received at the clock terminal. In particular, the memory element is configured to draw a charge from the top voltage terminal to the output terminal or drain the charge from the output terminal to the bottom voltage terminal. At least two of these memory elements are stacked by connecting (optionally via further circuitry) the bottom terminal of a first memory element to the top terminal of a second memory element to enable the charge to flow from the first memory element to the second memory element.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or electronic component or circuit combining the features of the items described.

What is claimed:

1. An electronic circuit for dividing a frequency of a periodic signal, comprising
   a plurality of memory elements, each memory element comprising an input terminal, an output terminal, a top voltage terminal, a bottom voltage terminal, and a clock terminal, wherein at least one of the memory elements is arranged with its output terminal coupled to the input terminal of another memory element wherein the electronic circuit is configured to generate an output signal having a smaller fundamental frequency than the clock signal at at least one of the output terminals;
   wherein each memory element is configured to change and hold a voltage at the output terminal based on a voltage at the input terminal at times controlled by a clock signal received at the clock terminal, by drawing a charge from the top voltage terminal to the output terminal or drain the charge from the output terminal to the bottom voltage terminal; and wherein at least two of the memory elements are stacked in the sense that the bottom terminal of a first memory element is connected to the top terminal of a second memory element to enable the charge to flow from the first memory element to the second memory element.

2. The electronic circuit of claim 1, further comprising a storage element, a first terminal of the storage element connected to the bottom voltage terminal of the first memory element and a top voltage terminal of the second memory element, the storage element configured to store the charge retrieved from the first memory element and provide the charge to the second memory element, wherein the storage element is configured to maintain a voltage in between the top voltage supply and the bottom voltage supply.

3. The electronic device of claim 2, wherein the first terminal of the storage element is connected to a plurality of bottom voltage terminals of a plurality of first memory elements and top voltage terminals of a plurality of second memory elements, the storage element configured to store the charge retrieved from the first memory elements and provide the charge to the second memory elements.

4. The electronic device of claim 1, wherein at least one of the memory elements comprises:
   an internal node which is, optionally via further circuitry, connected to the input terminal, and
   a transistor whose drain or source is connected to the top voltage terminal or the bottom voltage terminal, and whose gate is connected via a direct current (DC) biasing circuit to a bias voltage source, and via an alternate current (AC) coupling circuit to the internal node.

5. The electronic device of claim 4, wherein the source of the transistor is connected to the top voltage terminal or the bottom voltage terminal.

6. The electronic device of claim 5, wherein the drain of the transistor is connected to the output terminal.

7. The electronic device of claim 4, comprising both the transistor whose drain or source is connected to the top voltage terminal and the transistor whose drain or source is connected to the bottom voltage terminal, wherein different bias voltages are supplied to both transistors.

8. The electronic device of claim 1, wherein the memory elements are dynamic or static latches or dynamic or static flipflops.

9. The electronic circuit of claim 6, wherein each memory element further comprises:
   a transmission gate configured to vary a conductance between the input node and an internal node of the memory element, based on a clock signal received at the clock terminal and at the same frequency as the clock signal; and
   an inverter connected to the top voltage terminal and the bottom voltage terminal and configured to provide an inversion of a voltage at the internal node at the output terminal, wherein the inverters of said at least two memory elements are stacked.

10. The electronic circuit of claim 1, wherein the memory elements are arranged with their output terminal connected to the input terminal of another memory element to form a closed loop of memory elements configured to generate an output signal having a smaller fundamental frequency than the clock signal at at least one of the output terminals.

11. A method of providing a clock-dividing circuit with reduced power consumption by applying charge-sharing/reuse, the method comprising the steps of:
   providing a plurality of memory elements, each memory element comprising an input terminal, an output terminal, a top voltage terminal, a bottom voltage terminal, and a clock terminal,
   arranging at least one of the memory elements with its output terminal coupled to the input terminal of another memory element arranging the electronic circuit to generate, in operation, an output signal having a smaller fundamental frequency than the clock signal at at least one of the output terminals;
   configuring each memory element to change and hold a voltage at the output terminal based on a voltage at the input terminal at times controlled by a clock signal received at the clock terminal, by drawing a charge from the top voltage terminal to the output terminal or drain the charge from the output terminal to the bottom voltage terminal; and
   stacking at least two of the memory elements by connecting the bottom terminal of a first memory element to the top terminal of a second memory element to enable the charge to flow from the first memory element to the second memory element.

12. The method of claim 11, said clock dividing circuit is further comprising a storage element, a first terminal of the storage element connected to the bottom voltage terminal of the first memory element and a top voltage terminal of the second memory element, the storage element stores the charge retrieved from the first memory element and provide the charge to the second memory element, wherein the storage element maintains a voltage in between the top voltage supply and the bottom voltage supply.

13. The method of claim 12, wherein the first terminal of the storage element is connected to a plurality of bottom voltage terminals of a plurality of first memory elements and top voltage terminals of a plurality of second memory elements, the storage element stores the charge retrieved from the first memory elements and provide the charge to the second memory elements.

14. The method of claim 11, wherein at least one of the memory elements comprises:
   an internal node which is, optionally via further circuitry, connected to the input terminal, and
   a transistor whose drain or source is connected to the top voltage terminal or the bottom voltage terminal, and whose gate is connected via a direct current (DC) biasing circuit to a bias voltage source, and via an alternate current (AC) coupling circuit to the internal node.

15. The method of claim 14, wherein the source of the transistor is connected to the top voltage terminal or the bottom voltage terminal.

16. The method of claim 15, wherein the drain of the transistor is connected to the output terminal.

17. The method of claim 14, comprising both the transistor whose drain or source is connected to the top voltage terminal and the transistor whose drain or source is connected to the bottom voltage terminal, wherein different bias voltages are supplied to both transistors.

18. The method of claim 11, wherein the memory elements are dynamic or static latches or dynamic or static flipflops.

19. The method of claim 16, wherein each memory element further comprises:
   a transmission gate to vary a conductance between the input node and an internal node of the memory element, based on a clock signal received at the clock terminal and at the same frequency as the clock signal; and an inverter connected to the top voltage terminal and the bottom voltage terminal and said inverter provides an inversion of a voltage at the internal node at the output terminal, wherein the inverters of said at least two memory elements are stacked.

20. The method of claim 11, wherein the memory elements are arranged with their output terminal connected to the input terminal of another memory element to form a closed loop of memory elements generate an output signal having a smaller fundamental frequency than the clock signal at least one of the output terminals.

* * * * *